United States Patent
Jeong et al.

(10) Patent No.: US 7,236,081 B2
(45) Date of Patent: Jun. 26, 2007

(54) INDUCTOR AND METHOD OF FORMING THE SAME

(75) Inventors: Joo-Hyun Jeong, Yongin-si (KR); Chul-Ho Chung, Hwaseong-si (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 11/322,753

(22) Filed: Dec. 30, 2005

(65) Prior Publication Data

US 2006/0158302 A1 Jul. 20, 2006

(30) Foreign Application Priority Data

Jan. 3, 2005 (JP) .................... 10-2005-0000277

(51) Int. Cl.
*H01F 5/00* (2006.01)
(52) U.S. Cl. .................................... 336/200
(58) Field of Classification Search ............. 336/65, 336/83, 200, 232; 257/531
See application file for complete search history.

(56) References Cited

U.S. PATENT DOCUMENTS 6,903,644 B2 * 6/2005 Wang et al. ............. 336/200

| | | | |
|---|---|---|---|
| 2002/0064923 A1 * | 5/2002 | Yamauchi et al. | 438/382 |
| 2002/0153258 A1 * | 10/2002 | Filas et al. | 205/119 |
| 2004/0110355 A1 | 6/2004 | Hsieh | 438/381 |
| 2005/0024176 A1 * | 2/2005 | Wang et al. | 336/200 |
| 2005/0116317 A1 * | 6/2005 | Lee et al. | 257/531 |

FOREIGN PATENT DOCUMENTS

| KR | 10-0198804 | 3/1999 |
|---|---|---|
| KR | 10-2002-0039016 | 5/2002 |

* cited by examiner

*Primary Examiner*—Tuyen T. Nguyen
(74) *Attorney, Agent, or Firm*—Mills & Onello, LLP

(57) ABSTRACT

An inductor pattern is formed on a substrate. A conductive pattern having a concave-convex structure is formed on the inductor pattern to increase a surface area of the inductor pattern. An insulation layer is formed on the inductor pattern. After a groove is formed such that the insulation layer is removed to expose the inductor pattern, a conductive pattern is conformally formed on the groove and the insulation layer. Thus, a surface area of the inductor pattern as well as a thickness of an inductor increases to obtain an inductor of a high quality factor.

8 Claims, 7 Drawing Sheets

INDUCTOR AND METHOD OF FORMING THE SAME

PRIORITY STATEMENT

This application claims priority of Korean Patent Application No. 2005-00277, filed on Jan. 3, 2005 in the Korean Intellectual Property Office, the contents of which are incorporated herein in their entirety by reference.

BACKGROUND OF THE INVENTION

1. Field of the Invention

The present invention relates to a method of forming a semiconductor device and, more particularly, to a method of forming an inductor.

2. Description of Related Art

An inductor is used to apply a complementary metal oxide semiconductor (CMOS) technology to radio-frequency integrated circuits. An inductor is a passive device that is necessary for impedance matching in a high-frequency integrated circuit. Particularly, an inductor used in a high-frequency integrated circuit is required for a high quality factor to reduce phase noise.

FIG. 1 illustrates a cubic structure of a conventional inductor used in a high-frequency integrated circuit and an equivalent circuit diagram thereof. In FIG. 1, Ls denotes a total inductance of a self inductance of a spiral inductor and a mutual inductance between metal lines constituting the inductor; Rs denotes a sum of a DC resistance of the inductor and an AC resistance considering skin effect occurring at a high frequency; Cs denotes a capacitance of a parasitic capacitor formed between metal lines; Cp denotes a capacitance of a parasitic capacitor formed between an inductor and a substrate, the Cp being calculated from a thickness of an insulation layer formed between the substrate and the inductor; and Rp denotes a superhigh frequency leakage effect of a silicon substrate, the superhigh frequency leakage effect being modeled with resistors.

An entire quality factor (Q) of the equivalent circuit shown in FIG. 1 is expressed by the following equation [Equation 1].

$$Q = \frac{\text{Magnetic Energy }(Em) - \text{Electric Energy }(Ee)}{\text{Energy Loss }(Eloss)} \quad \text{[Equation 1]}$$

The magnetic energy (Em), electric energy (Ee), and energy loss (Eloss) of Equation 1 are obtained by the following equations [Equation 2] through [Equation 4], respectively.

$$Em = \frac{V^2 wLs}{2[(wLs)^2 + Rs^2]} \quad \text{[Equation 2]}$$

$$Ee = \frac{V^2 w(Cs + Cp)}{2} \quad \text{[Equation 3]}$$

$$Eloss = \frac{V^2}{2}\left[\frac{1}{Rp} + \frac{Rs}{(wLs)^2 + Rs^2}\right] \quad \text{[Equation 4]}$$

Referring to Equation 2 through Equation 4, V denotes voltage and w denotes frequency. With the rise of capacitances Cs and Cp of a parasitic capacitor formed by coupling with Rs, the magnetic energy Em becomes greater while electrical energy Ee and energy loss Eloss become smaller. Further, the rise of the capacitance Cs and Cp may result in a higher quality factor which may be obtained by Equation 1. Accordingly, there is a need to reduce a resistance of a conductive layer and a capacitance of a sacrificial capacitor in order to obtain a higher quality factor.

Conventionally, several approaches have been suggested to reduce a capacitance of a parasitic capacitor. One of the approaches is that a grounding metal layer is formed on a substrate to perform shielding, and another is that an inductor is formed and a substrate below the inductor is etched. Unfortunately, these conventional approaches need an extra CMOS process, which increases process cost.

FIG. 2 is a cross-sectional view of a conventional inductor. In the inductor illustrated in FIG. 2 is that metal layers increase in number while reducing a resistance Rs of a conductive layer in order to obtain a high quality factor taking into consideration the above issues, which is disclosed in U.S. Pat. No. 6,062,161.

Referring to FIG. 2, a first insulation layer 5 is formed on a substrate 1. A first conductive pattern 20 is formed on the first insulation layer 5. A second insulation layer 7 is stacked and a second conducive pattern 10 is formed on the first conductive pattern 20. The first and second conductive patterns 20 and 10 are interconnected by a contact hole 30 to constitute an inductor, which result in the effect that a thickness of a conductive layer increases. Thus, a resistance of the conductive layer decreases. A lead wiring 20A connected through a contact hole is formed to results in decreasing the number of entire metal layers. A reference number 10A denotes a lead wiring connected to the second conductive pattern 10, as illustrated in FIG. 1.

As previously stated, a resistance of a conductive layer is equal to sum of DC resistance and an AC resistance reflecting the skin effect arising at a superhigh frequency, of an inductor. An inductor illustrated in FIG. 2 may have an effect to reduce a DC resistance by increasing thickness of a metal layer but may not have an effect to enhance the skin effect arising at a superhigh frequency.

In view of the foregoing, there is a need for a method for forming a an inductor of high-quality factor where a thickness of metal used in the inductor increases to reduce a resistance thereof while reducing the skin effect arising at a superhigh frequency.

SUMMARY OF THE INVENTION

According to a first aspect, the present invention is directed to a method for forming an inductor. According to the method, an inductor pattern is formed on a substrate. An insulation layer is formed on the inductor pattern. The insulation layer is at least partially removed to expose the inductor pattern and form a groove. A conductive pattern is conformally formed along a step between the insulation layer and the bottom of the groove where the inductor pattern is exposed.

In one embodiment, a width of the groove is greater than that of the inductor pattern. The inductor pattern can be made of copper or aluminum. The conductive pattern can be made of aluminum. The groove can include a plurality of sub-grooves. A thickness of the conductive pattern can be greater than that of the inductor pattern. The conductive pattern can be aluminum and the inductor pattern can be made of copper or aluminum.

According to another aspect, the invention is directed to a method for forming an inductor. According to the method, an insulation layer is formed on a substrate. The insulation layer is patterned to form a groove defining an area where the inductor is to be formed. An inductor pattern is conformally formed along a step between the insulation layer and the bottom of the groove.

In one embodiment, the groove includes a plurality of sub-grooves. The inductor pattern can be made of aluminum.

According to another aspect, the invention is directed to an inductor. The inductor includes an inductor pattern formed on a substrate and an insulation layer formed on the inductor pattern such that the inductor pattern is at least partially exposed. A conductive pattern is formed along a step between the insulation layer and the bottom of the groove where the inductor pattern is formed, the conductive pattern being connected to the inductor pattern to increase a surface area of the inductor pattern.

The inductor pattern can be made of aluminum or copper. The conductive pattern can be made of aluminum. The groove can include a plurality of sub-grooves. A thickness of the conductive pattern can be larger than that of the inductor pattern. A width of the groove can be larger than that of the inductor pattern. The conductive pattern can be made of aluminum and the inductor pattern can be made of copper or aluminum. The conductive pattern can be used as a power line.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

The present invention will now be described more fully hereinafter with reference to the accompanying drawings, in which preferred embodiments of the invention are shown. It will be understood that when a layer is referred to as being "on" another layer or substrate, it can be directly on the other layer or substrate, or intervening layers may also be present.

EMBODIMENT 1

FIG. 3A through FIG. 3D are cross-sectional views illustrating a method for forming an inductor according to a first embodiment of the present invention.

A substrate 100 may include insulation layers, metal layers, and via holes filled with a conductive material to interconnect the metal layers. A grounding metal layer may be formed on the substrate 100 to reduce substrate loss. Although not shown in the figures, a conductive line may be formed at the substrate 100 to connect an inductor in accordance with the invention with another device.

A lower insulation layer 101 is formed on the substrate 100. Formation of the lower insulation layer 101 is done by coating a polymer-group layer using a spin-on coating manner or by depositing a lightly doped oxide layer including methyl or ethyl using chemical vapor deposition (CVD). The lower insulation layer 101 may be made of, for example, spin-on glass (SOG), undoped silicate glass (USG), phosphorus silicate glass (PSG), or fluorine doped silicate glass (FSG).

An inductor pattern 103 is formed on the lower insulation layer 101 formed on the substrate 100. The inductor pattern 103 may be made of aluminum (Al), tungsten (W) or copper (Cu). Formation of the inductor pattern 103 may be done using electroplating or electroless plating.

In the event that an inductor pattern is made of copper, an intermediate insulation layer (not shown) may be formed on the lower insulation layer 101 and patterned to define a location where an inductor pattern is to be formed. After it is filled with copper, chemical mechanical polishing (CMP) is performed to form the inductor pattern 103. Although not shown in the figures, a diffusion barrier layer and/or an anti-reflective layer may further be formed on the layer 103. Typically, the diffusion barrier layer may be made of TiN, Ti, TaN, WN, or TiSiN and have a thickness of about 5-100 angstroms. The anti-reflective layer may be made of pure poly ethylene oxide (PEOS) and have a thickness of about 500-1000 angstroms.

Figure 3A:
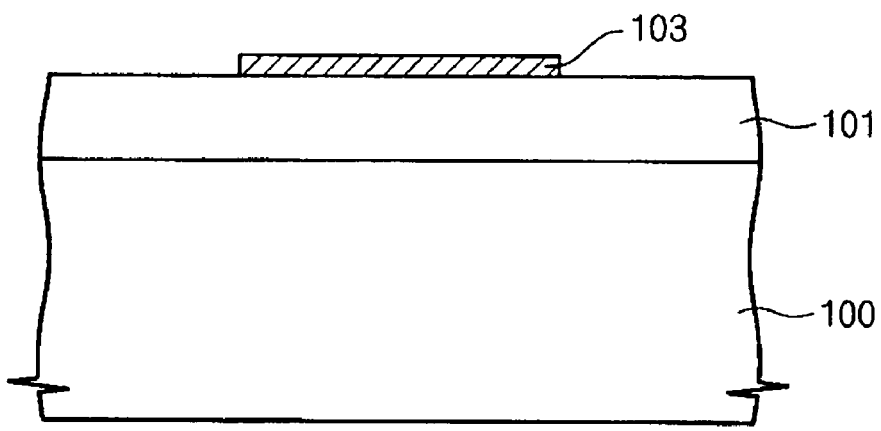
FIG. 3A through FIG. 3D are schematic cross-sectional views illustrating a method for forming an inductor according to a first embodiment of the present invention.
Figure 3B:
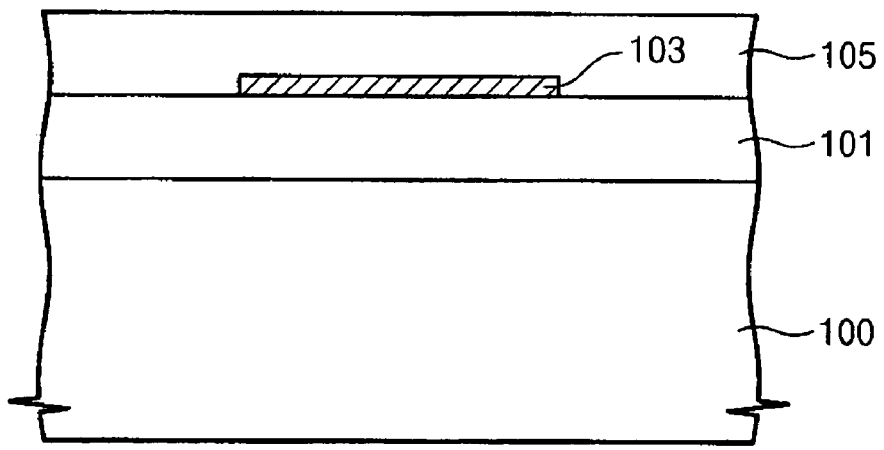

Referring to FIG. 3B, an upper insulation layer 105 is formed on the lower insulation layer 101 and the inductor pattern 103 to a thickness of about 6500-10000 angstroms. The upper insulation layer 105 may be made of spin-on glass (SOG), undoped silicate glass (USG), phosphorus silicate glass (PSG), fluorine doped silicate glass (FSG), and plasma enhanced tetraethyl orthosilicate glass (PETEOS). The upper insulation layer 105 may include one or more insulation layers which are sequentially stacked. For example, the upper insulation layer 105 may be made of FSG having a thickness of about 6500 angstroms and PTEOS having a thickness of 2500 angstroms which are stacked in that order.

Figure 3C:
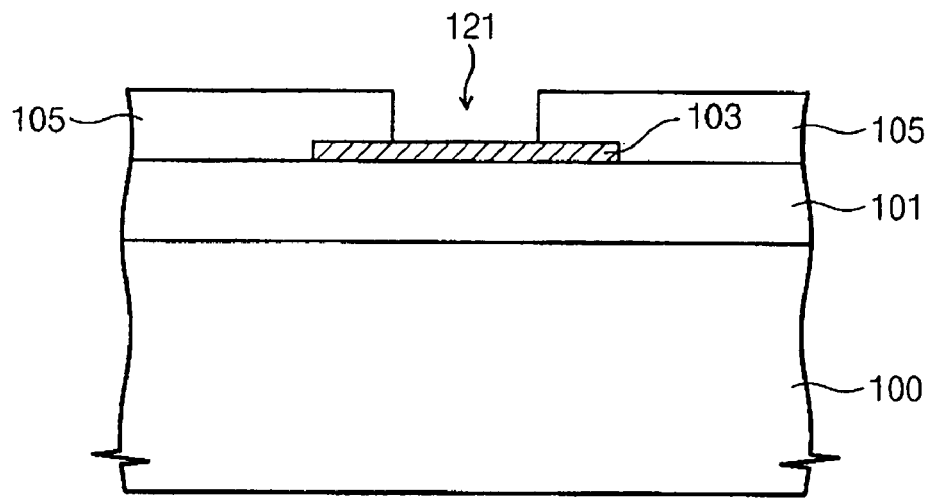
Figure 3D:
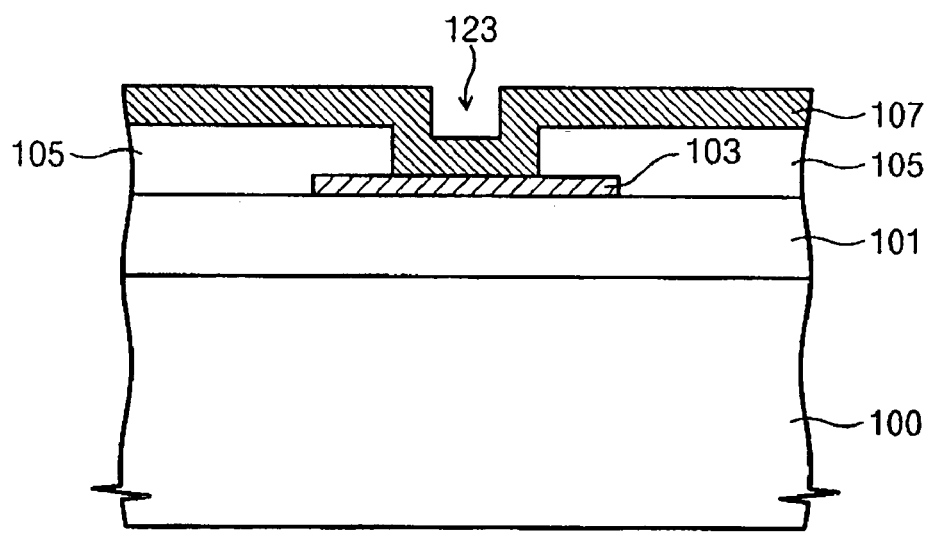

Referring to FIG. 3C, the upper insulation layer 105 is at least partially removed by performing a dry etch process using a photolithographic process to expose the inductor pattern 103. The groove 121 is formed along the inductor pattern 103. Namely, the groove 121 is formed to extend along the direction to which the inductor pattern 103 extends. As illustrated in FIG. 3D, a conductive pattern 107 is conformally formed on the upper insulation layer 105 and the exposed inductor pattern 103 in the groove 121. The conductive pattern 107 may be made of metal such as, for example, aluminum. A thickness of the conductive pattern 107 may be larger than that of the inductor pattern 103.

Figure 1:
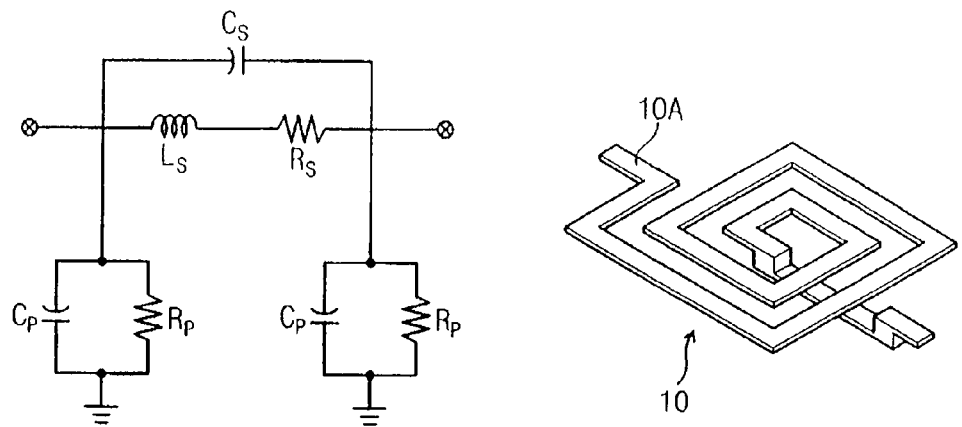
FIG. 1 contains a schematic view of a cubic structure of a conventional inductor used in a high frequency integrated circuit and an equivalent circuit thereof.
Figure 2:
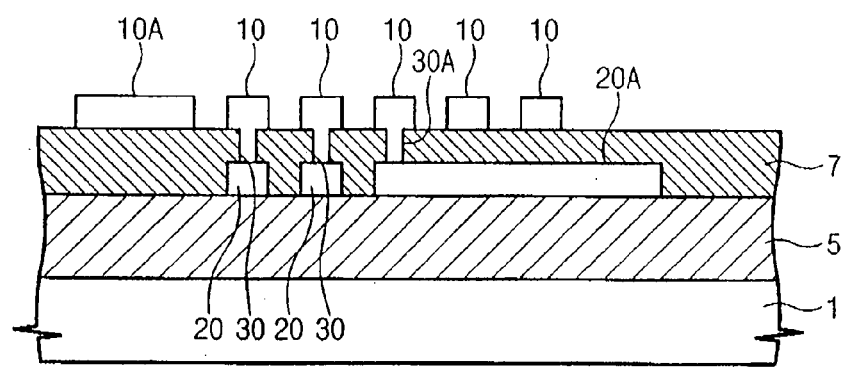
FIG. 2 is a cross-sectional view of an inductor formed using a conventional method.
Figure 4:
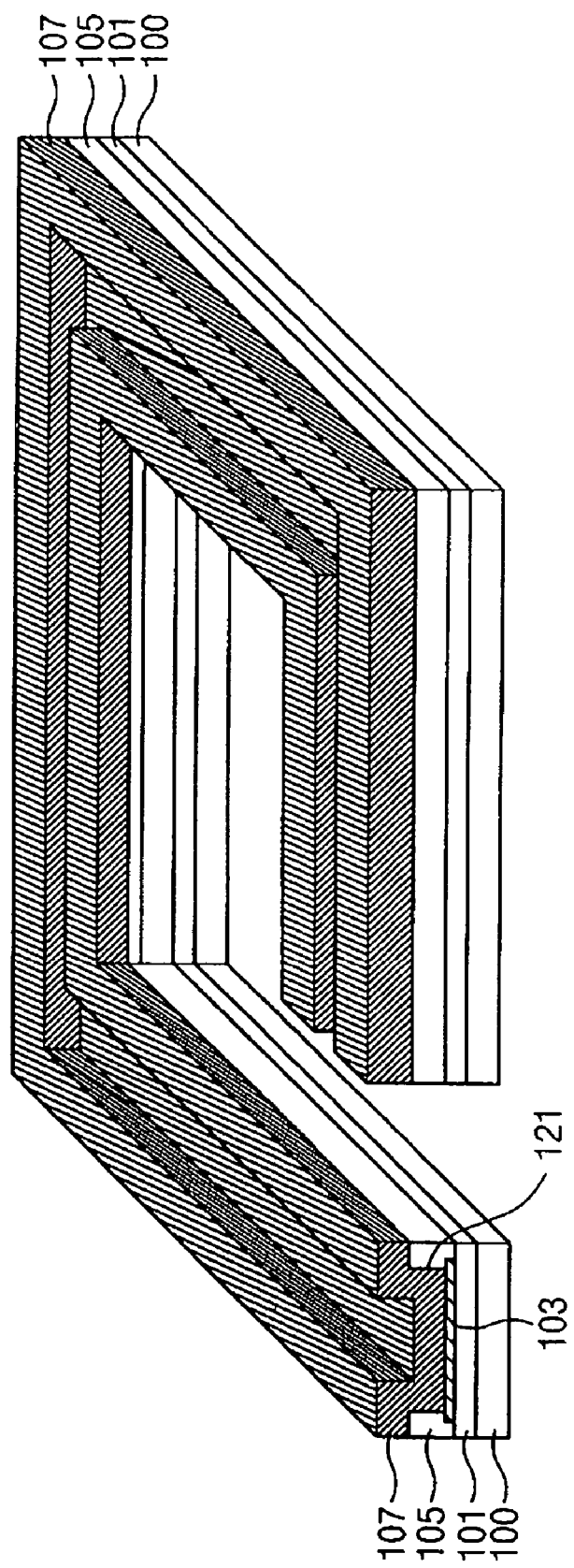
FIG. 4 is a schematic perspective view of the inductor according to the first embodiment of the present invention.

As illustrated in FIG. 3D and FIG. 4, the conductive pattern 107 is formed in the groove 121 to form groove 123. Thus, a surface area of the inductor pattern increases more than a flat structure such as the conventional inductor shown in FIG. 1. In order to increase surface area, a groove including a plurality of sub-grooves may be formed to expose the inductor pattern 103 (the sub-grooves being spaced apart at regular intervals). In this case, a groove having a plurality of concave-convex structures is formed on the inductor pattern 103. According to the present invention, a conductive pattern 107 is further formed on the inductor pattern 103 to achieve the effect that a thickness of an inductor increases substantially.

EMBODIMENT 2

Figure 5A:
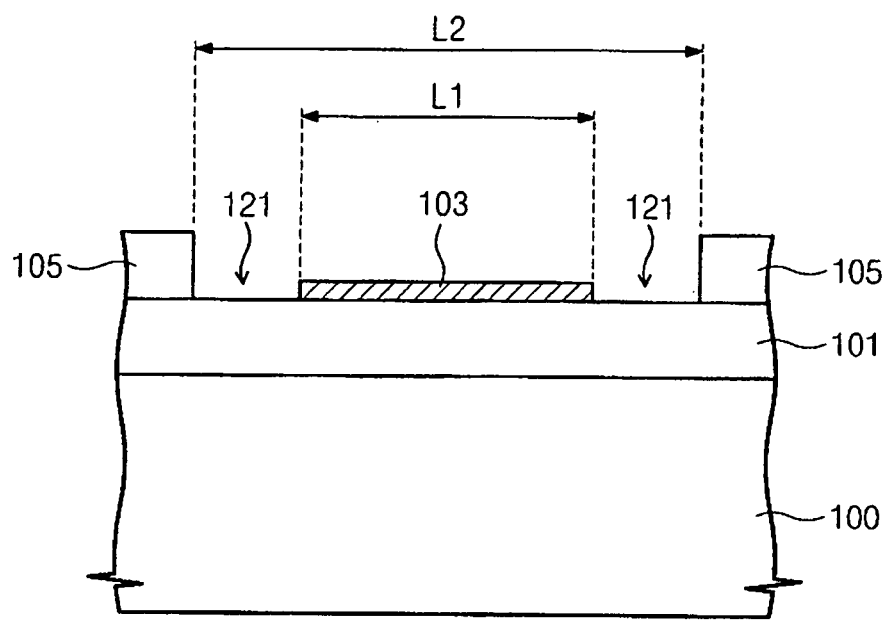
FIG. 5A and FIG. 5B are schematic cross-sectional views illustrating a method for forming an inductor according to a second embodiment of the present invention.
Figure 5B:
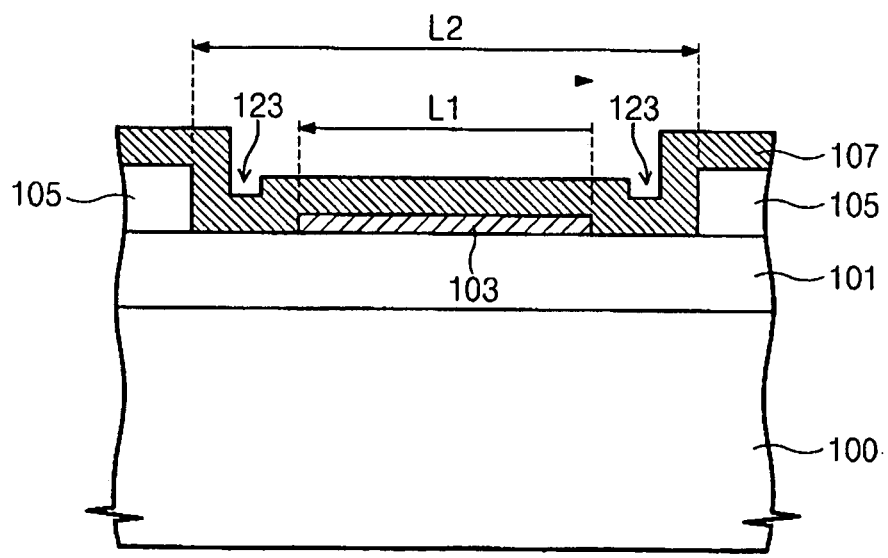

FIG. 5A and FIG. 5B are cross-sectional views illustrating a method for forming an inductor according to a second embodiment of the present invention.

An inductor pattern 103 is formed on a lower insulation layer 101 formed on a substrate 100 and an upper insulation layer is formed on the inductor pattern 103, which are the same steps as described above in connection with the first embodiment.

Referring to FIG. 5A, an upper insulation layer 105 is removed to provide an opening in the upper insulation layer 105 having a width L2, which is larger than the width L1 of the inductor pattern 103. As a result, groove 121 is formed to sufficiently expose the inductor pattern 103. The groove 121 is formed along the inductor pattern 103 as described above in connection with the first embodiment. Namely, the groove 121 is formed to extend along the direction to which the inductor pattern 103 extends. Thus, the whole of the inductor pattern 103 and a part of the lower insulation layer 101 are exposed. A conductive pattern 107 is conformally formed along a step between a top of the upper insulation layer 105 and the exposed inductor pattern and a step between the top of the upper insulation layer 105 and the lower insulation layer 101, as illustrated in FIG. 5B. Thus, a groove 123 is also formed on the conductive pattern 107. The conductive pattern 107 is thicker than the inductor pattern 103. The conductive pattern 107 is connected to the inductor pattern 103 to achieve the effect that a surface area of inductor pattern 103 and a thickness of the inductor increase.

EMBODIMENT 3

Figure 6A:
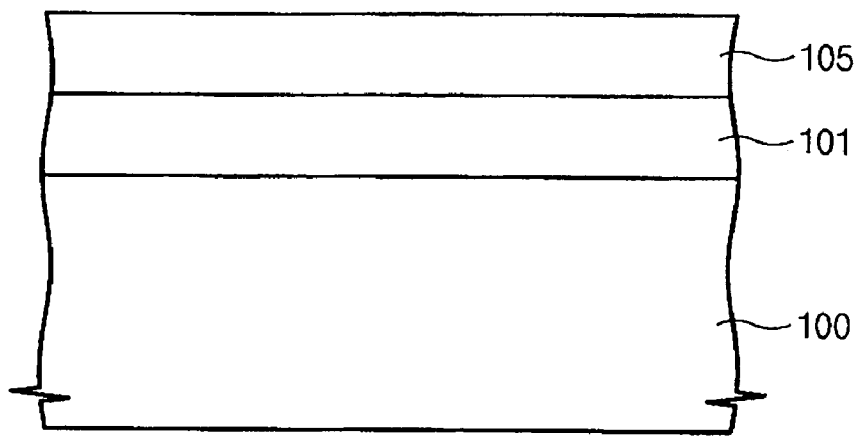
FIG. 6A through FIG. 6C are schematic cross-sectional views illustrating a method for forming an inductor according to a third embodiment of the present invention.
Figure 6B:
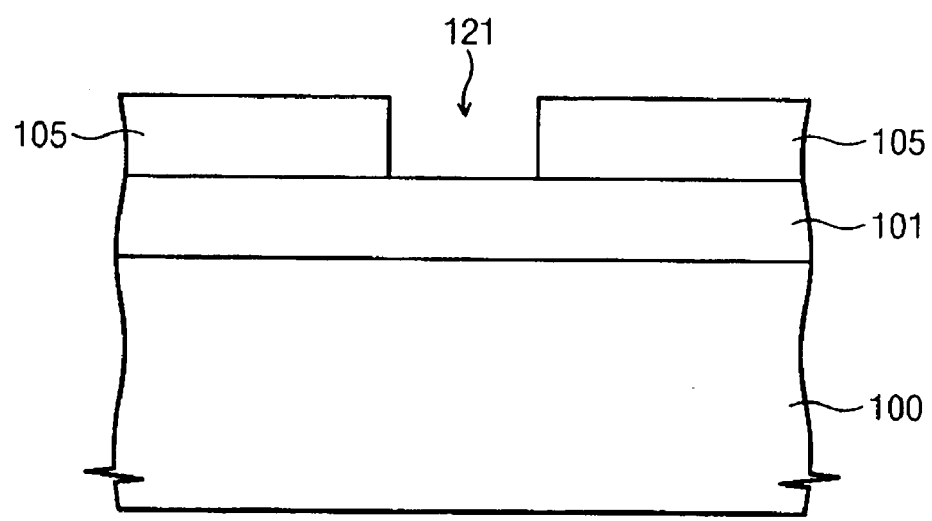
Figure 6C:
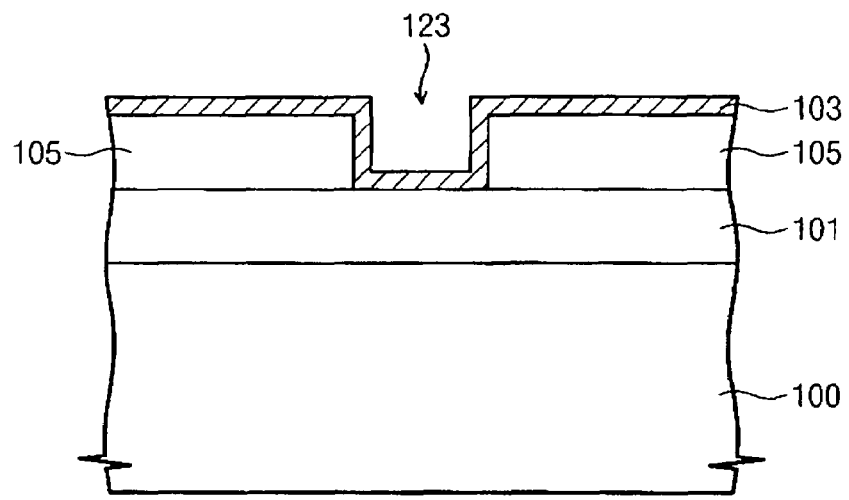

FIG. 6A through FIG. 6C are cross-sectional views illustrating a method for forming an inductor according to a third embodiment of the present invention.

A lower insulation layer 101 is formed on a substrate 100. A conductive line is formed at the substrate 100 to connect inductors to be formed on a substrate with other devices. An upper insulation layer 105 is formed on a lower insulation layer 103. The upper insulation layer 101 is patterned to form a groove 121 defining a region where an inductor pattern 103 is to be formed. An inductor pattern 103 is conformally formed on the groove 121. Although only one groove is illustrated in the figures, a plurality of grooves may be formed to increase surface area. According to this embodiment, a groove is formed by patterning the insulation layer 101, and an inductor pattern 103 is formed on the insulation layer 101 to increase a surface area more than a conventional inductor shown in FIG. 1.

TEST EMBODIMENT

A high-frequency structure simulator (HFSS) simulation tool was used to analyze the amount of increase in quality factor with increase in thickness of a metal line used as a practical inductor, in accordance with the invention. The inductor was an octagonal inductor and was set to the same size relative to all thicknesses. In the test, a thickness of a metal line layer was 8000 angstroms assuming that only an inductor is formed, 2 micrometers assuming that only a conductive pattern is formed, and 2.8 micrometers assuming that an inductor pattern and a conductive pattern are formed. A pattern was made of aluminum.

Figure 7:
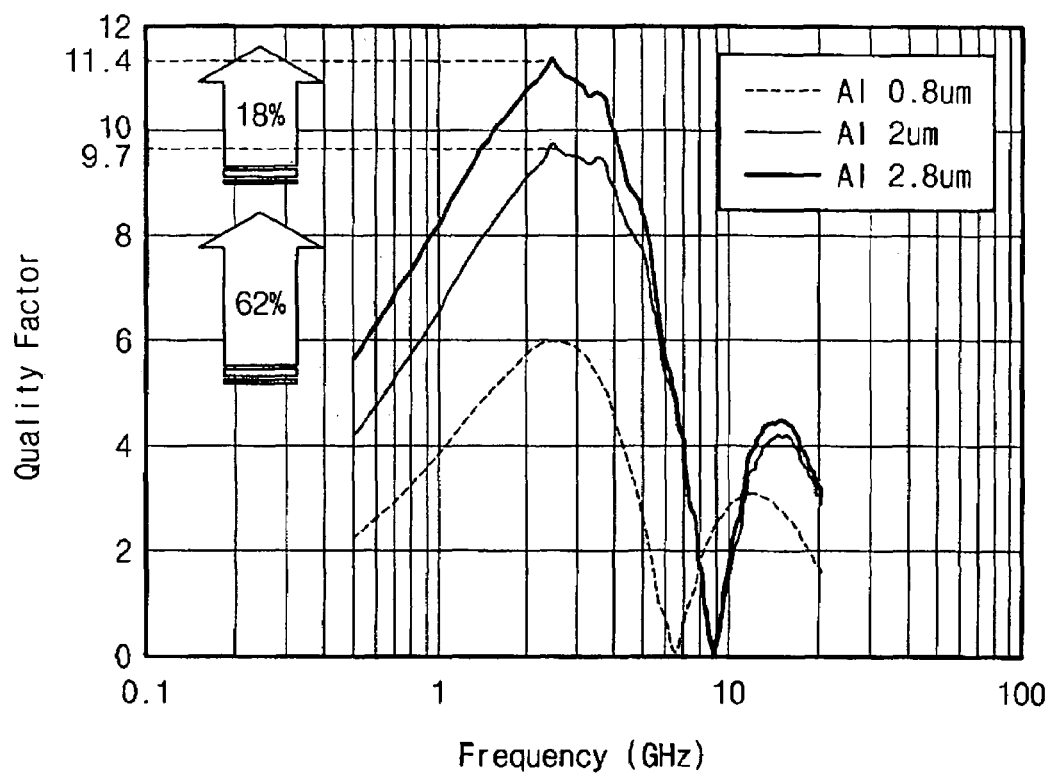
FIG. 7 is a graph showing a relationship between a quality factor and change of a thickness of an inductor pattern.

As a result of the test, quality factor values based on thickness change of an inductor pattern were obtained, which are shown in a graph of FIG. 7. In a case where a thickness of an inductor pattern is 8000 angstroms, a maximum of a quality factor value was 6; in a case where the thickness of the inductor pattern is 2 micrometers, the maximum of the quality factor value was 9.7; and in a case where the thickness of the inductor pattern is 2.8 micrometers, the maximum of the quality factor value was 11.4. That is, in a case where a conductive pattern having a thickness of 2 micrometers is formed on an inductor pattern, quality factor increased by 62 percent as compared to the case where only a conductive pattern is formed, and increased by 18 percent as compared to the case where a conductive pattern is further formed on an inductor pattern. In conclusion, quality factor increases with increase in thickness of an inductor factor. The above result reflects only the effect based on increase in thickness of a metal line layer. In view of the effect based on increase of a surface area when a groove is formed, a practical quality factor may increase more.

According to the present invention, a DC current decreases with increase in thickness of a metal line layer used as an inductor and a skin effect occurring at a high frequency is reduced with increase in a surface area of a metal line layer. Thus, an inductor of a high quality factor is obtained.

Although not shown in the figures, the above metal line layer and a metal line layer formed on an inductor may be used as a power line for transferring power. With increase in surface area of a metal line layer, resistance is lowered to reduce energy loss that arises when power is transferred.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An inductor comprising:
    an inductor pattern formed on a substrate;
    an insulation layer on the inductor pattern and having a groove along the inductor pattern to expose the inductor pattern, the groove exposing a top surface and a sidewall of the inductor pattern; and
    a conductive pattern in the groove and on the top surface and sidewall of the inductor pattern and on the insulation layer to be connected to the inductor pattern.

2. The inductor as recited in claim 1, wherein the inductor pattern comprises at least one of aluminum and copper.

3. The inductor as recited in claim 1, wherein the conductive pattern comprises aluminum.

4. The inductor as recited in claim 1, wherein the groove further exposes a top surface of an insulation layer outside the inductor pattern.

5. The inductor as recited in claim 1, wherein a thickness of the conductive pattern is larger than that of the inductor pattern.

6. The inductor as recited in claim 1, wherein a width of the groove is larger than that of the inductor pattern.

7. The inductor as recited in claim 5, wherein the conductive pattern comprises aluminum and the inductor pattern comprises at least one of copper and aluminum.

8. The inductor as recited in claim 1, wherein the conductive pattern is used as a power line.

* * * * *